(12) United States Patent
Yang et al.

(10) Patent No.: US 8,198,194 B2
(45) Date of Patent: Jun. 12, 2012

(54) METHODS OF FORMING P-CHANNEL FIELD EFFECT TRANSISTORS HAVING SIGE SOURCE/DRAIN REGIONS

(75) Inventors: Jong Ho Yang, Gyeonggi-do (KR); Hyung-rae Lee, Seoul (KR); Jin-Ping Han, Fishkill, NY (US); Chung Woh Lai, Singapore (SG); Henry K. Utomo, Newburgh, NY (US); Thomas W. Dyer, Pleasant Valley, NY (US)

(73) Assignees: Samsung Electronics Co., Ltd. (KR); Chartered Semiconductor Manufacturing Ltd., Singapore (SG); International Business Machines Corporation, Armonk, NY (US)

( * ) Notice: Subject to any disclaimer, the term of this patent is extended or adjusted under 35 U.S.C. 154(b) by 156 days.

(21) Appl. No.: 12/729,486

(22) Filed: Mar. 23, 2010

(65) Prior Publication Data

US 2011/0237039 A1   Sep. 29, 2011

(51) Int. Cl.
   *H01L 21/311*   (2006.01)
(52) U.S. Cl. ........ 438/700; 438/197; 438/301; 438/712; 257/E21.042; 257/E21.043; 257/E21.051; 257/E21.058; 257/E21.115; 257/E21.182; 257/E21.218; 257/E21.227; 257/E21.421
(58) Field of Classification Search .................. 438/270, 438/700, 197, 199, 301, 311, 712; 257/E21.042, 257/43, 51, 58, 115, 182, 218, 227, 421, 257/E21.043, E21.051, E21.058, E21.115, 257/E21.182, E21.218, E21.227, E21.421
See application file for complete search history.

(56) References Cited

U.S. PATENT DOCUMENTS

| 6,566,204 | B1 * | 5/2003 | Wang et al. | 438/286 |
| 6,846,708 | B2 * | 1/2005 | Feudel et al. | 438/162 |

(Continued)

FOREIGN PATENT DOCUMENTS

KR   10-2006-0060691 A   6/2006

(Continued)

OTHER PUBLICATIONS

Moroz et al., "Physical Modeling of Defects, Dopant Activation and Diffusion in Aggressively Scaled Bulk and SOI Devices: Atomistic and Continuum Approaches," Materials Research Society, http://www.mrs.org/s_mrs/sec_subscribe.asp?CID=6470&DID=177430&action=detail&css . . . , Admitted Prior Art, Printed from the Internet Jul. 2, 2008.

(Continued)

*Primary Examiner* — David Nhu
(74) *Attorney, Agent, or Firm* — Myers Bigel Sibley & Sajovec, P.A.

(57) ABSTRACT

Methods of forming p-channel MOSFETs use halo-implant steps that are performed relatively early in the fabrication process. These methods include forming a gate electrode having first sidewall spacers thereon, on a semiconductor substrate, and then forming a sacrificial sidewall spacer layer on the gate electrode. A mask layer then patterned on the gate electrode. The sacrificial sidewall spacer layer is selectively etched to define sacrificial sidewall spacers on the first sidewall spacers, using the patterned mask layer as an etching mask. A PFET halo-implant of dopants is then performed into portions of the semiconductor substrate that extend adjacent the gate electrode, using the sacrificial sidewall spacers as an implant mask. Following this implant step, source and drain region trenches are etched into the semiconductor substrate, on opposite sides of the gate electrode. These source and drain region trenches are then filled by epitaxially growing SiGe source and drain regions therein.

11 Claims, 15 Drawing Sheets

U.S. PATENT DOCUMENTS

| | | | |
|---|---|---|---|
| 6,949,796 B1 | 9/2005 | Ellis-Monaghan et al. | |
| 7,135,724 B2 | 11/2006 | Chen et al. | |
| 7,645,656 B2 | 1/2010 | Chen et al. | |
| 7,879,668 B2 | 2/2011 | Rhee et al. | |

FOREIGN PATENT DOCUMENTS

| | | |
|---|---|---|
| KR | 10-2007-0053300 A | 5/2007 |
| KR | 10-2009-0069930 A | 7/2009 |
| WO | WO 2006/039377 A1 | 4/2006 |

OTHER PUBLICATIONS

Wang et al., "Precision control of halo implantation for scaling-down ULSI manufacturing," IEEE Xplore, http://ieeexplore.org/Xplore/login.jsp?url=/iel5/10113/32408/01513336.pdf?temp=x..., Admitted Prior Art, Printed from the Internet, Jul. 2, 2008.

Notice of Allowance (issuance date: Mar. 8, 2012) issued by the KIPO for Korean Patent Application No. 10-2010-0079768 which was filed on Aug. 18, 2010.

* cited by examiner

US 8,198,194 B2

METHODS OF FORMING P-CHANNEL FIELD EFFECT TRANSISTORS HAVING SIGE SOURCE/DRAIN REGIONS

FIELD OF THE INVENTION

The present invention relates to methods of forming integrated circuit devices and, more particularly, to methods of forming integrated circuit devices having p-channel field effect transistors therein.

BACKGROUND OF THE INVENTION

Methods of forming complementary-metal-oxide-semiconductor (CMOS) field effect transistors may include selectively forming p-channel transistors having silicon germanium (SiGe) source and drain regions within a silicon substrate. As illustrated by FIGS. 1A-1P, one conventional method includes forming a semiconductor substrate 10 having a plurality of electrically insulating trench isolation regions 14 therein. These trench isolation regions 14 are illustrated in FIG. 1A as separating semiconductor well regions of different conductivity type. These semiconductor well regions are illustrated as a P-well region 12a and an adjacent N-well region 12b. A gate electrode of an NMOS transistor and a gate electrode of a PMOS transistor are formed on the P-well region 12a and the N-well region 12b, respectively. The gate electrode of the NMOS transistor is illustrated as including a gate oxide layer 16a, a polysilicon gate layer 18a, a silicon nitride capping layer 22a and a separating oxide capping layer 20a. The gate electrode of the PMOS transistor is illustrated as including a gate oxide layer 16b, a polysilicon gate layer 18b, a silicon nitride capping layer 22b and a separating oxide capping layer 20b. An oxide layer 24, which may be formed as a thermal oxide layer having a non-uniform thickness, is formed on a surface of the substrate 10 and on the sidewalls and top surfaces of the gate electrodes.

Referring now to FIGS. 1B-1C, a silicon nitride layer 26 is conformally deposited on the substrate 10 and on the gate electrodes of the NMOS and PMOS transistors and then a patterned photoresist mask 28 is selectively formed on the P-well regions 12a to cover regions where the NMOS transistor(s) is to be formed. Exposed portions of the silicon nitride layer 26 are then selectively etched for a sufficient duration to expose the oxide layer 24 and define silicon nitride spacers 26a on sidewalls of the gate electrode of the PMOS transistor. Thereafter, as illustrated by FIGS. 1E-1F, the patterned photoresist mask 28 is removed to expose a patterned silicon nitride layer 26b. The silicon nitride spacers 26a and the patterned silicon nitride layer 26b (and trench isolation regions 14) are then used as an etching mask during a reactive ion etching (RIE) step. During this RIE step, source and drain region trenches 30 are formed in the N-well region 12b. Then, as illustrated by FIG. 1G, an epitaxial growth step is selectively performed to define silicon germanium (SiGe) source and drain regions 32 within the trenches 30. A step may then be performed to selectively remove silicon nitride from the intermediate structure of FIG. 1G. In particular, as illustrated by FIG. 1H, a hot phosphoric acid solution is used to selectively etch back the silicon nitride spacers 26a, the patterned silicon nitride layer 26b and the silicon nitride capping layer 22b.

Thereafter, an electrically insulating layer 34 is conformally deposited on the intermediate structure of FIG. 1H. This electrically insulating layer may be a low temperature oxide (LTO) layer having a sufficient thickness to operate as sidewall spacers. In particular, a reactive ion etching (RIE) step may be performed to etch back the electrically insulating layer 34 to thereby define the sidewall spacers 34a and 34b, as illustrated by FIG. 1J. A patterned photoresist layer 36 is then formed to cover the P-well region 12a. As illustrated by FIGS. 1K-1M, the patterned photoresist layer 36 is then used as an implant mask during a step to form source/drain regions 37b and a halo implant region 39b within the N-well region 12b, by performing horizontal PMOS halo and source/drain implantation. During these steps, P-type source/drain dopants 37a are implanted into the N-well region 12b, using the gate electrode of the PMOS transistor and the sidewall spacers 34b as an implant mask. In addition, halo dopants 39a are implanted underneath the sidewall spacers 34b using a horizontal halo (i.e., high angle) implant step to define a halo region 39b, which inhibits short-channel effects within the PMOS transistor. The patterned photoresist layer 36 is then removed (e.g., stripped).

Similarly, as illustrated by FIGS. 1N-1P, a patterned photoresist layer 40 is then formed and used as an implant mask during a step to further define additional source/drain regions 37d and an additional halo implant region 39d within the N-well region 12b, by performing vertical PMOS halo and source/drain implantation. During these steps, P-type source/drain dopants 37c are implanted into the N-well region 12b, using the gate electrode of a PMOS transistor and the sidewall spacers 34b as an implant mask. In addition, halo dopants 39c are implanted underneath the sidewall spacers 34b using a vertical halo (i.e., high angle) implant step to define a halo region 39d, which inhibits short-channel effects within a PMOS transistor. The patterned photoresist layer 40 is then removed (e.g., stripped) and additional processing steps (not shown) as performed.

SUMMARY OF THE INVENTION

Methods of forming integrated circuit transistors according to some embodiments of the present invention include methods of forming p-channel MOSFETs using early halo-implant steps. In particular, the methods include forming a gate electrode having first sidewall spacers thereon, on a semiconductor substrate, and then forming a sacrificial sidewall spacer layer on the gate electrode. A mask layer is then patterned on the gate electrode. The sacrificial sidewall spacer layer is selectively etched to define sacrificial sidewall spacers on the first sidewall spacers, using the patterned mask layer as an etching mask. A PFET halo-implant of dopants is then performed into portions of the semiconductor substrate that extend adjacent the gate electrode, using the sacrificial sidewall spacers as an implant mask. Following this implant step, source and drain region trenches are etched into the semiconductor substrate, on opposite sides of the gate electrode. These source and drain region trenches are then filled by epitaxially growing SiGe source and drain regions therein. The sacrificial sidewall spacers are then selectively removed from sidewalls of the gate electrode. This removal of the sacrificial sidewall spacers is followed by implanting source and drain region dopants into the SiGe source and drain regions, using the gate electrode and the first sidewall spacers as an implant mask.

According to some of these embodiments of the present invention, the first sidewall spacers may be formed of a nitride material and the step of forming a sacrificial sidewall spacer layer on the gate electrode may include depositing a sacrificial oxide layer on the gate electrode. The sacrificial sidewall spacers may also be selectively removed from sidewalls of the gate electrode by exposing the sacrificial sidewall spacers to a hydrofluoric acid solution. In addition, the step of performing a PFET halo-implant may include performing a PFET halo-implant into portions of the semiconductor substrate extending adjacent the gate electrode, using the patterned mask layer and the sacrificial sidewall spacers as an implant mask.

Methods of forming p-channel MOSFETs may also include forming first and second gate electrodes extending in orthogonal directions relative to each other, on a semiconductor substrate. First and second sidewall spacers are then formed on the first and second gate electrodes, respectively, and a sacrificial sidewall spacer layer is formed on the first and second gate electrodes. A mask layer is also formed on the first and second gate electrodes. The sacrificial sidewall spacer layer is then selectively etched to define sacrificial sidewall spacers on the first and second sidewall spacers, using the patterned mask layer as an etching mask.

A quad PFET halo-implant is performed into portions of the semiconductor substrate extending adjacent the first and second gate electrodes, using the patterned mask layer as an implant mask. Thereafter, source and drain region trenches are etched into the semiconductor substrate, on opposite sides of the first and second gate electrodes. These source and drain region trenches are then filled by epitaxially growing SiGe source and drain regions therein. Thereafter, the sacrificial sidewall spacers are selectively removed from sidewalls of the first and second gate electrodes. Source and drain region dopants are then implanted into the SiGe source and drain regions, using the first and second gate electrodes and the first and second sidewall spacers as an implant mask.

DETAILED DESCRIPTION OF PREFERRED EMBODIMENTS

Figure 1A:
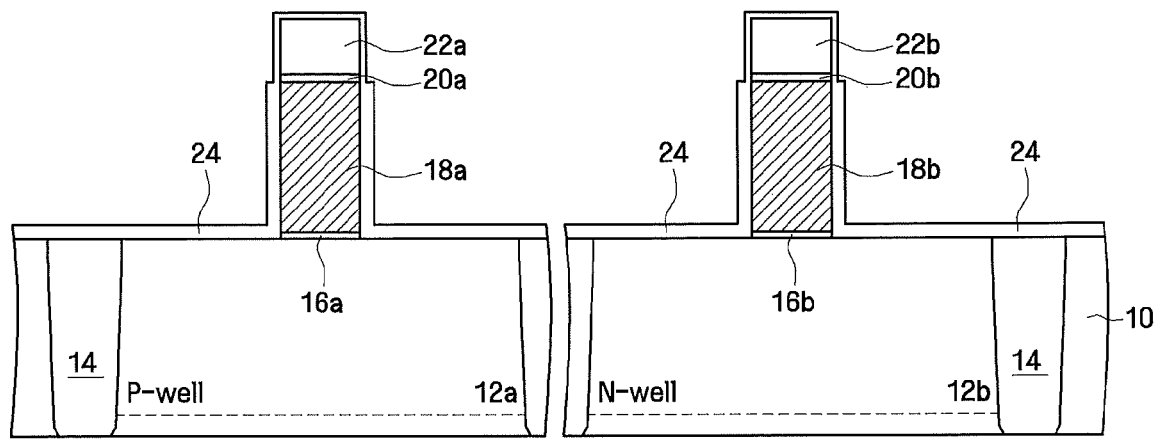
FIGS. 1A-1P are cross-sectional views of intermediate structures that illustrate conventional methods of forming CMOS integrated circuit devices.
Figure 1B:
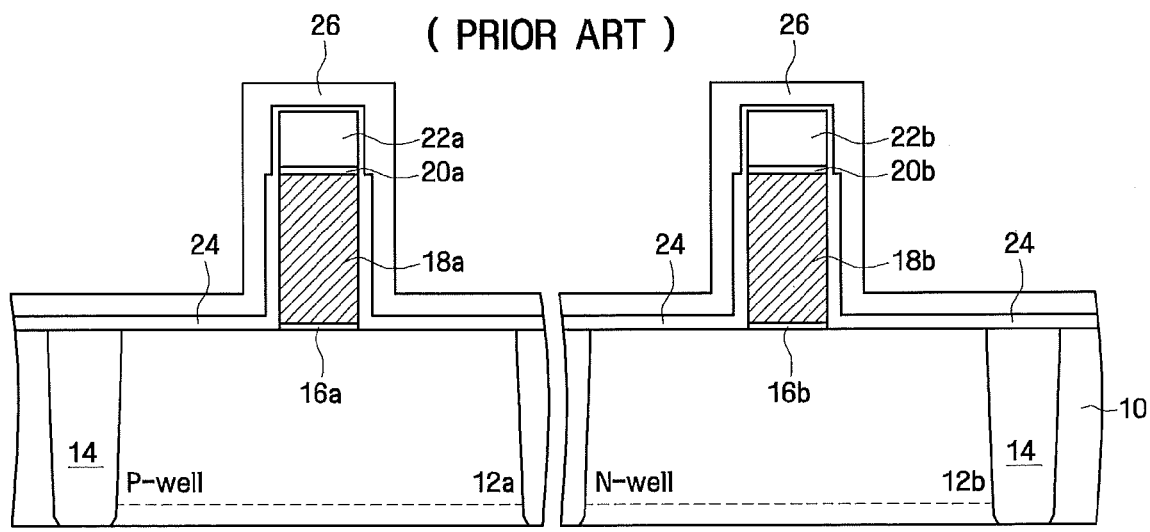
Figure 1C:
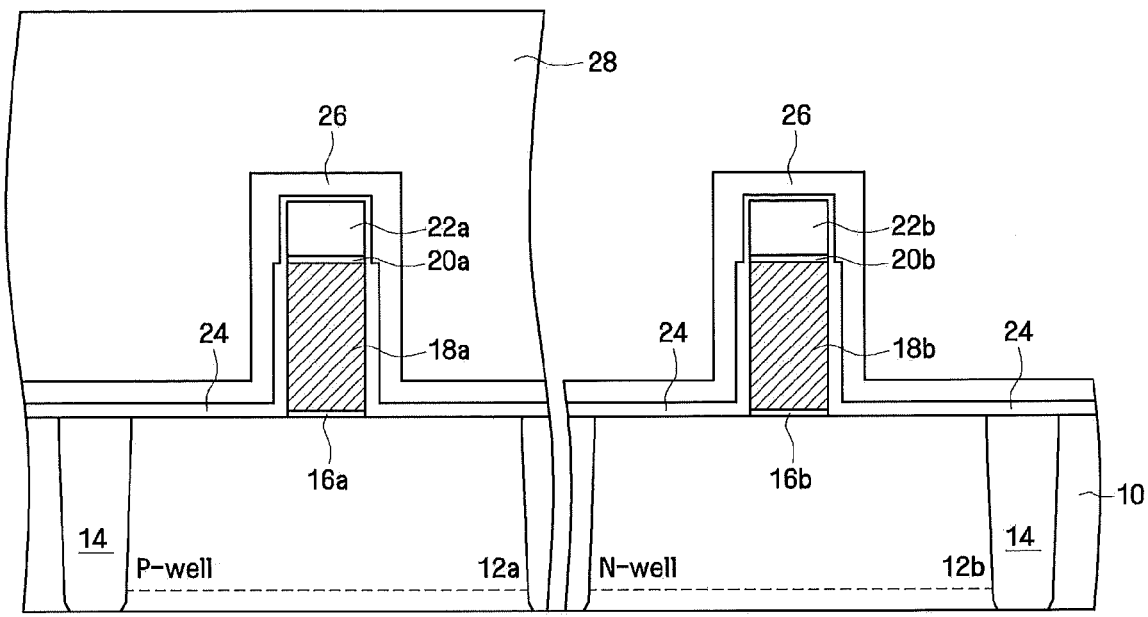
Figure 1D:
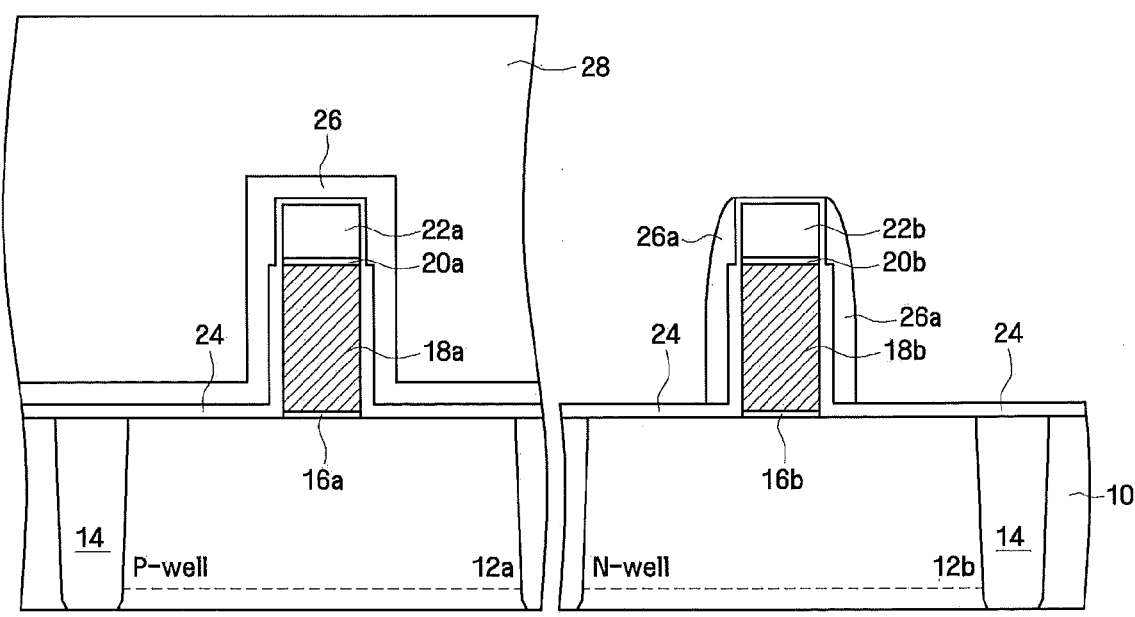
Figure 1E:
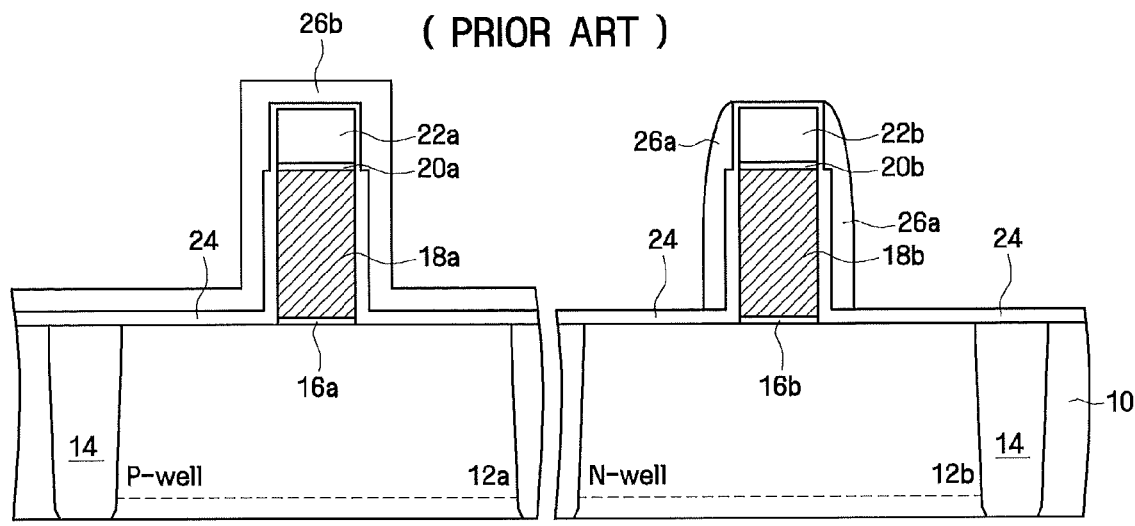
Figure 1F:
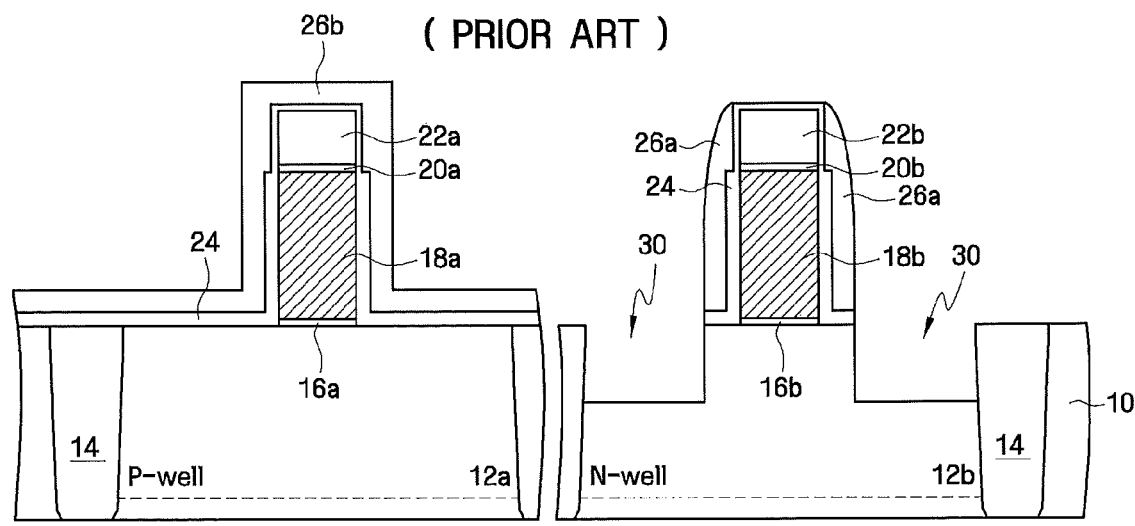
Figure 1G:
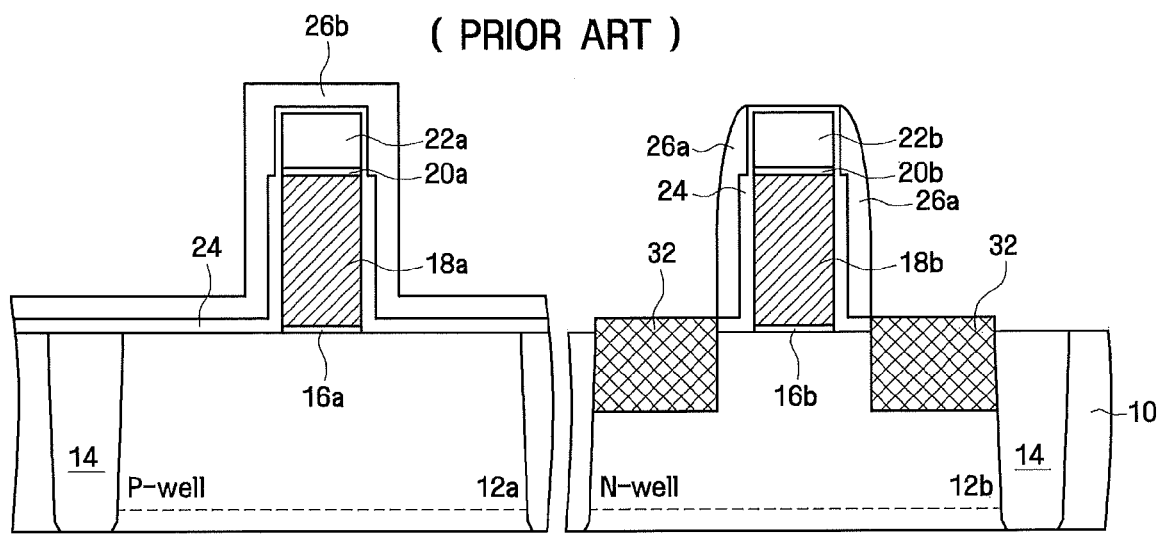
Figure 1H:
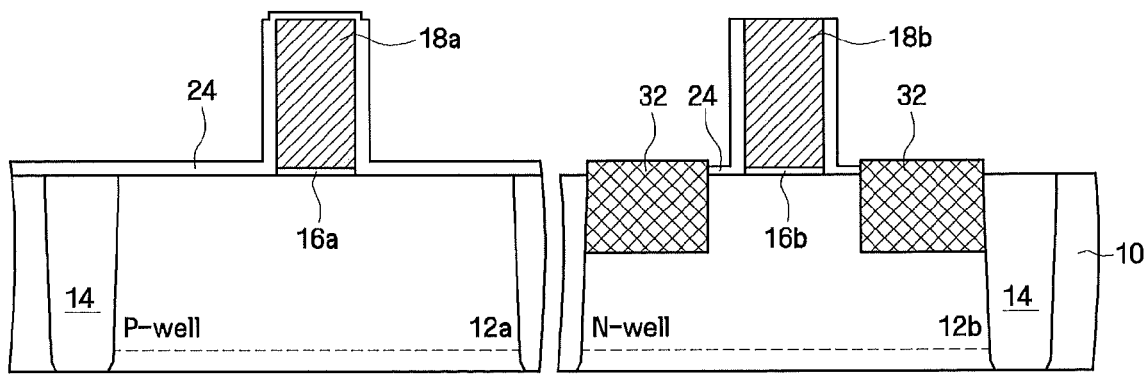
Figure 1I:
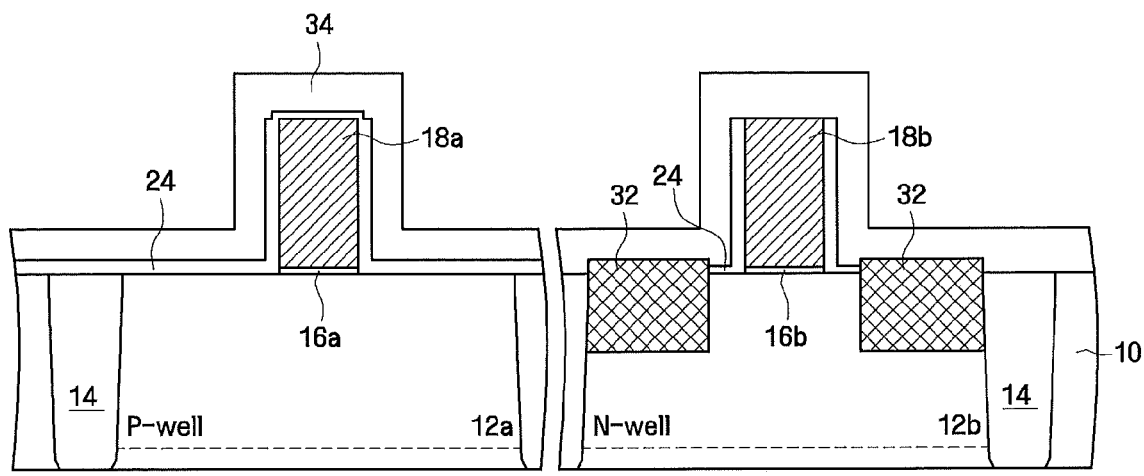
Figure 1J:
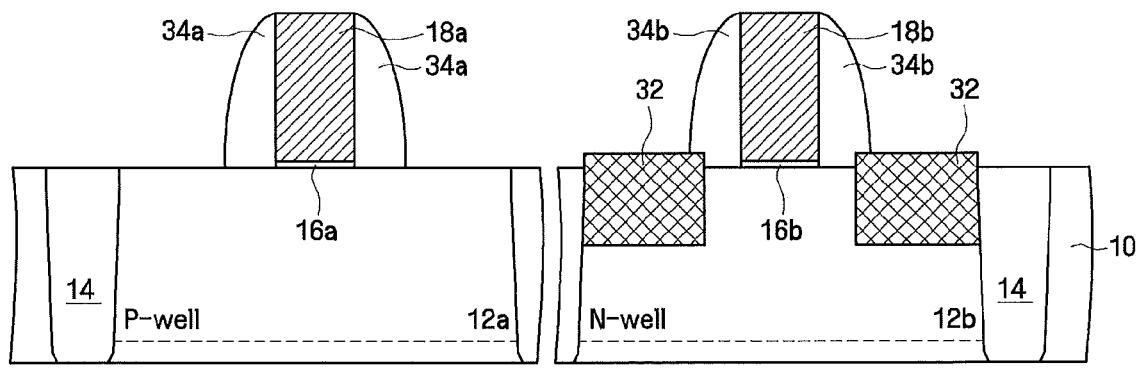
Figure 1K:
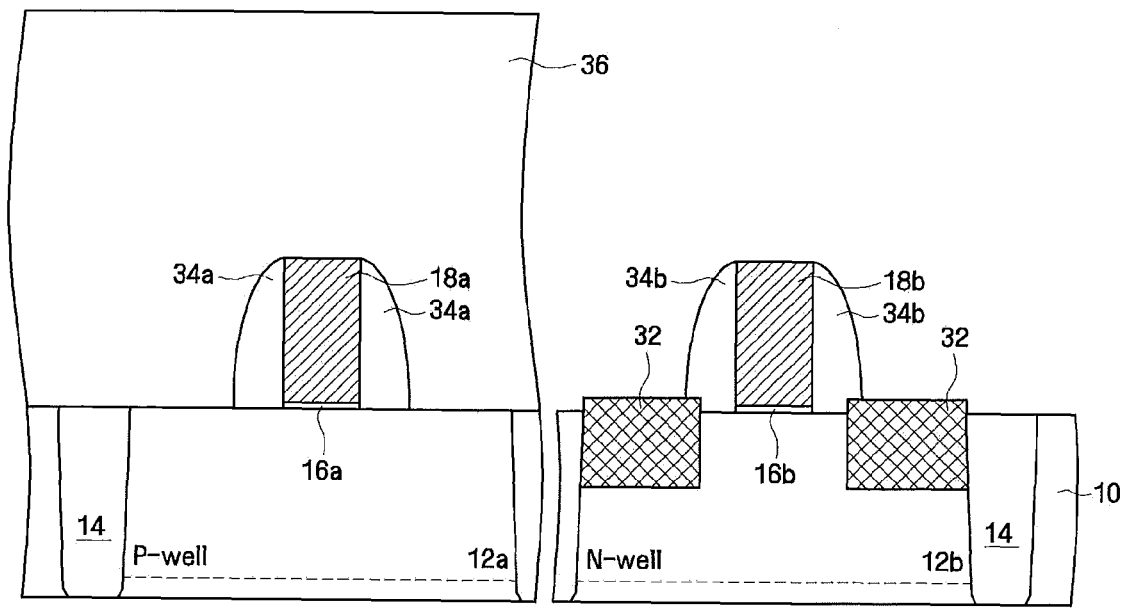
Figure 1L:
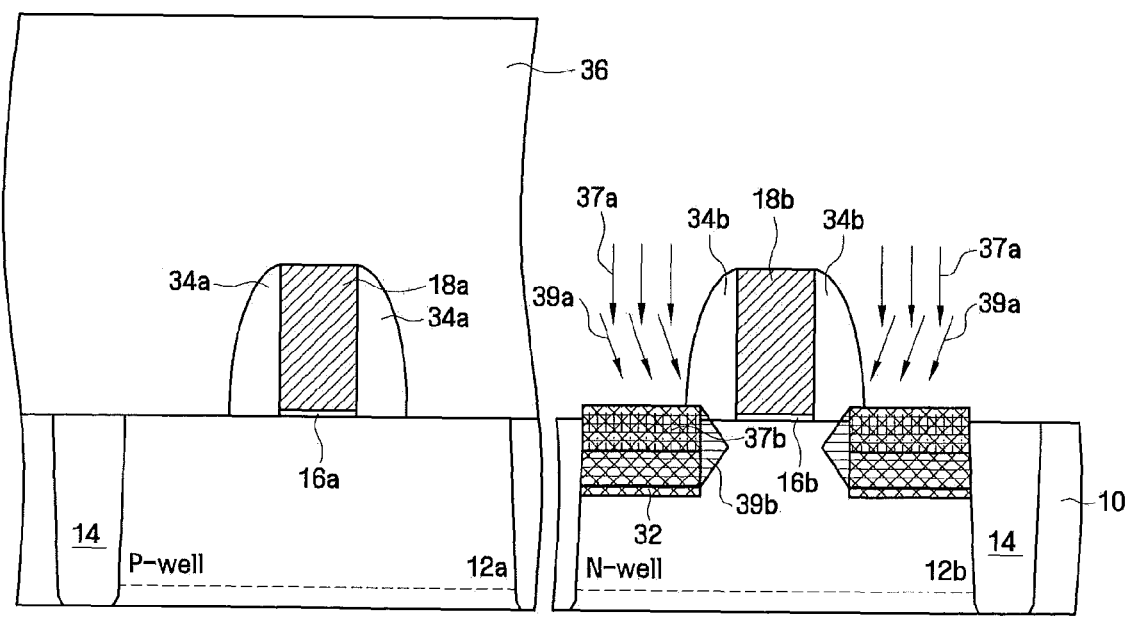
Figure 1M:
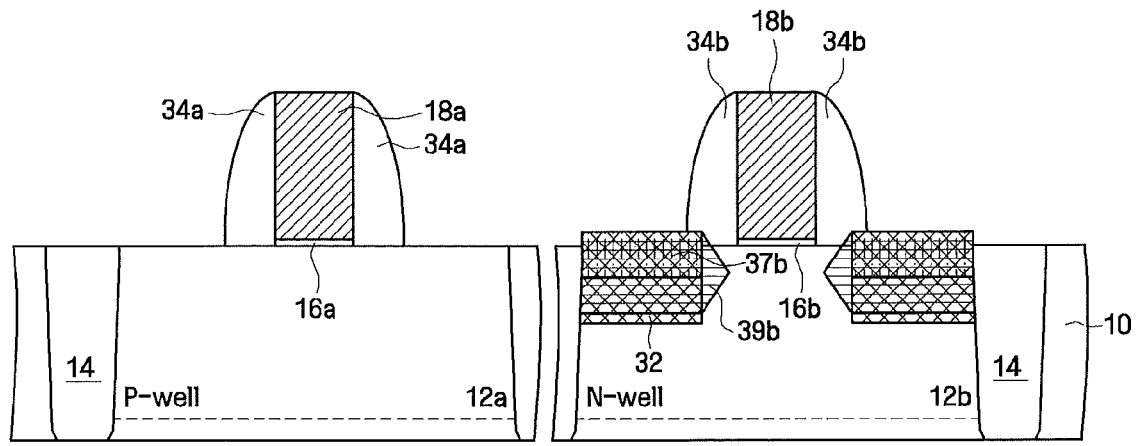
Figure 1N:
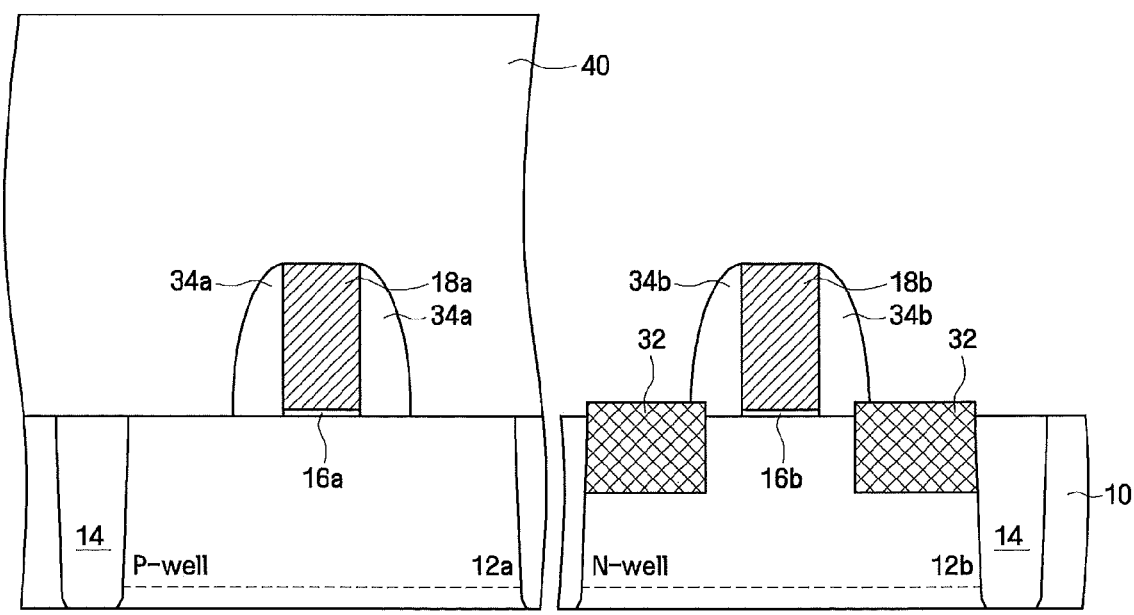
Figure 1O:
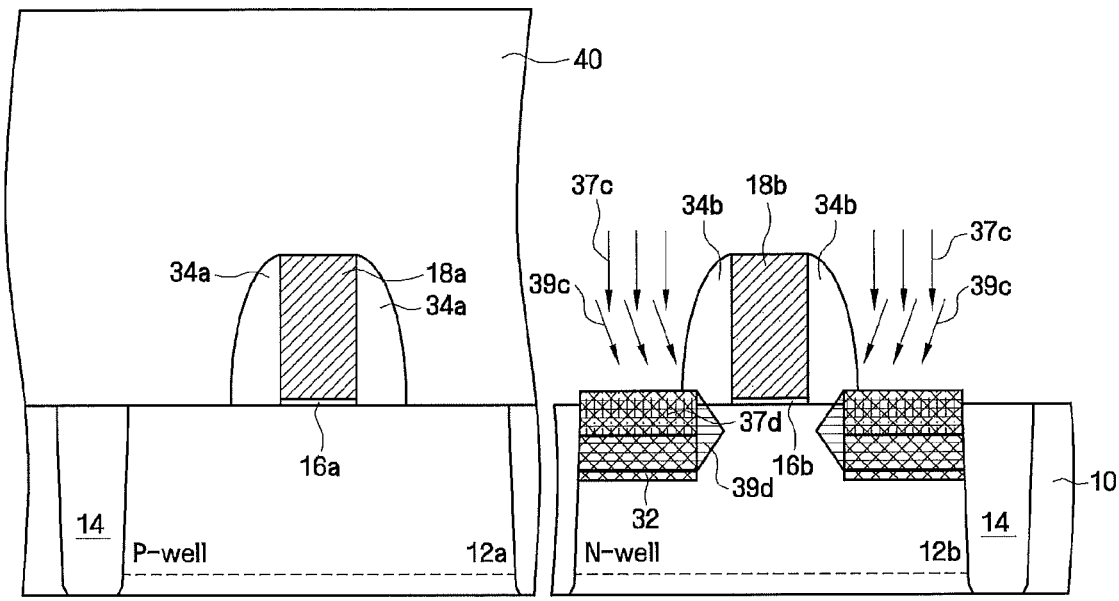

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Figure 2A:
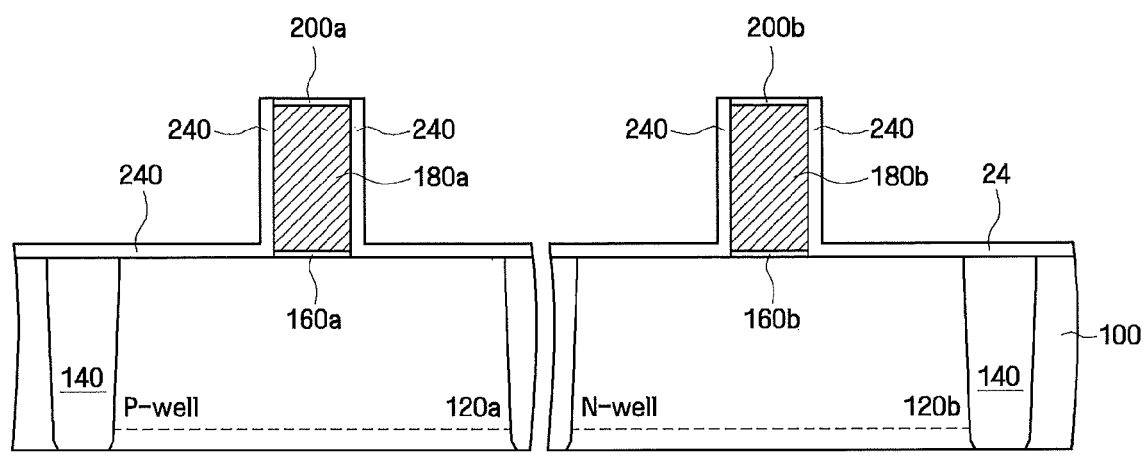
FIGS. 2A-2N are cross-sectional views of intermediate structures that illustrate methods of forming PMOS field effect transistors according to embodiments of the present invention.
Figure 2B:
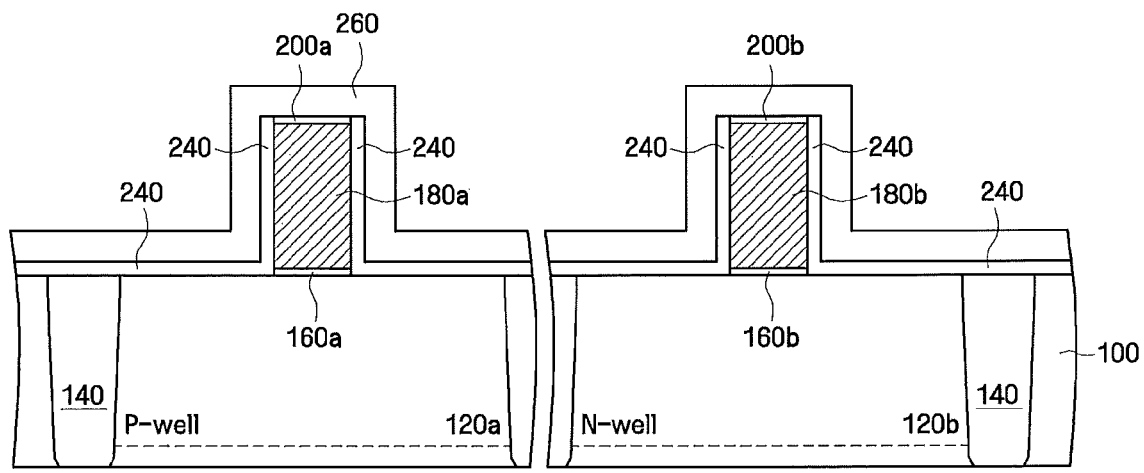
Figure 2C:
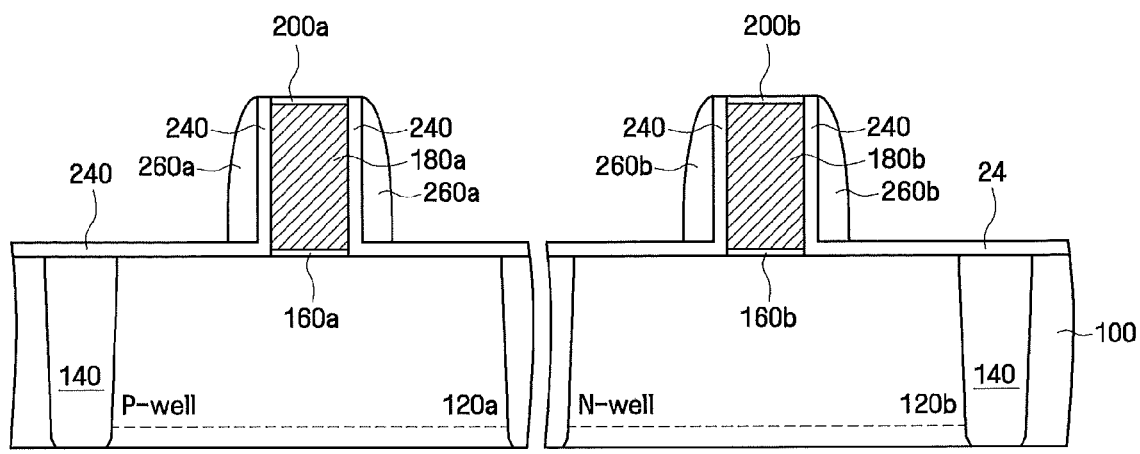
Figure 2D:
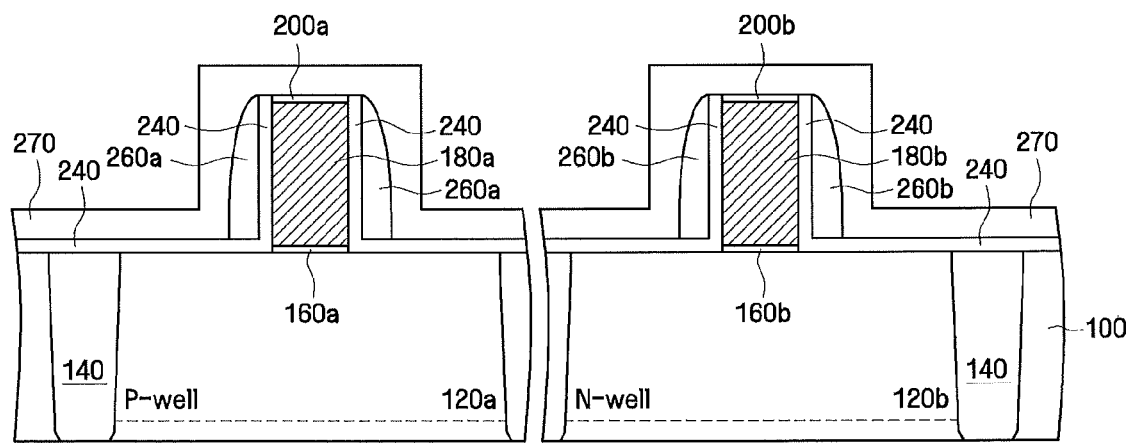
Figure 2E:
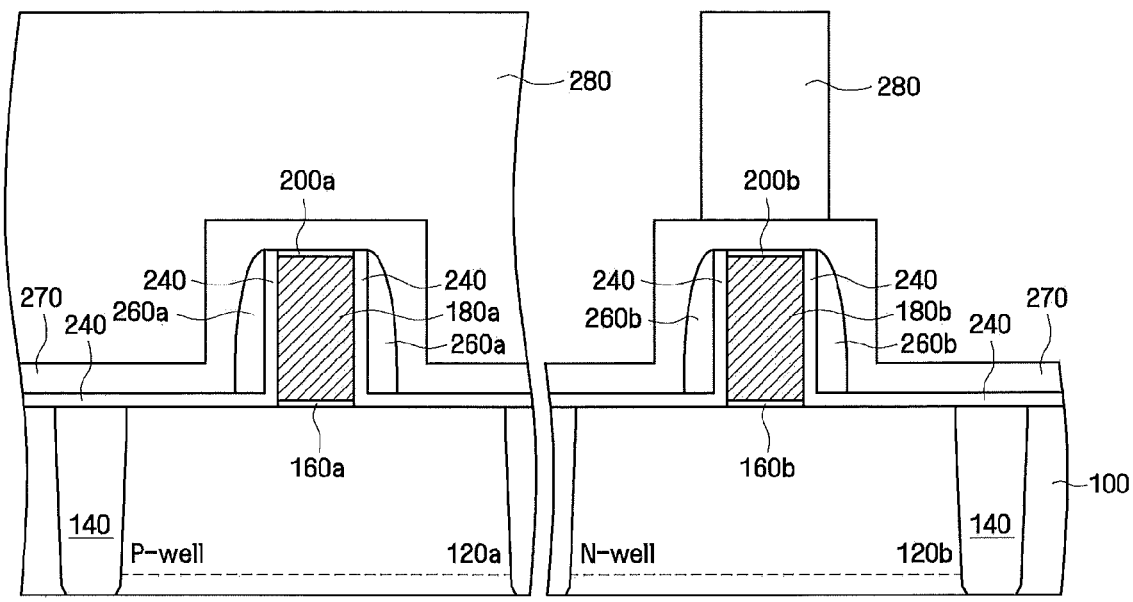
Figure 2F:
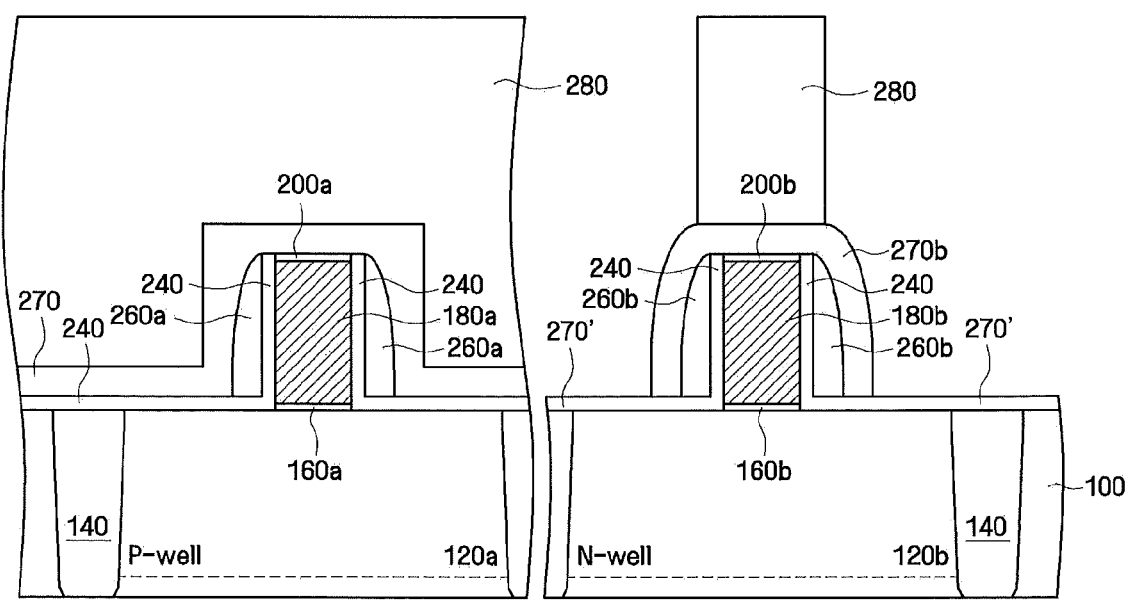
Figure 2G:
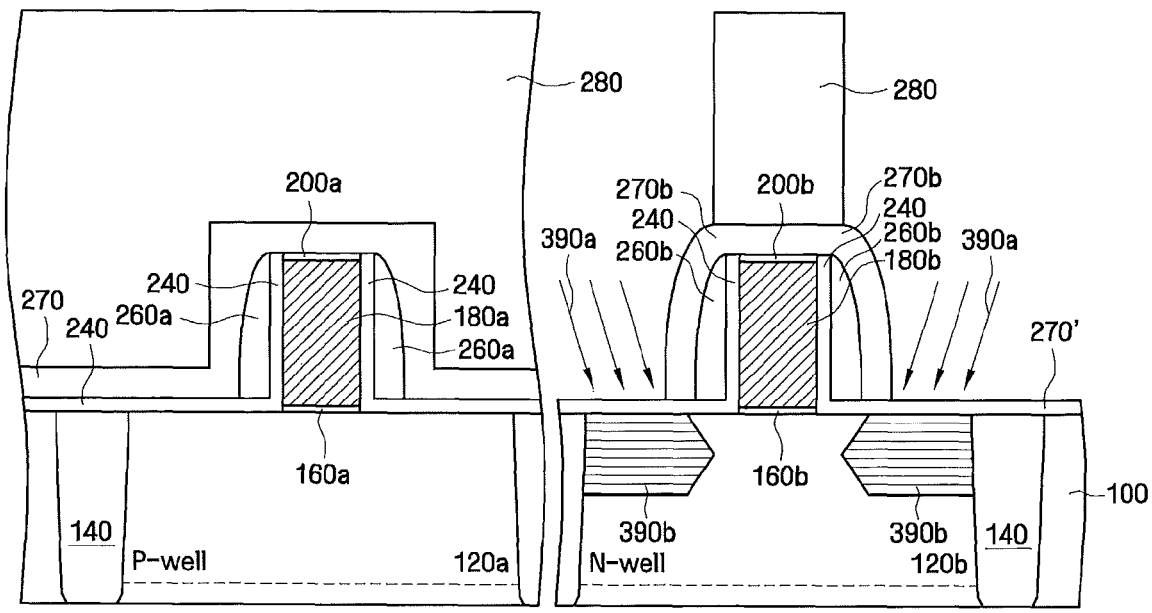
Figure 2H:
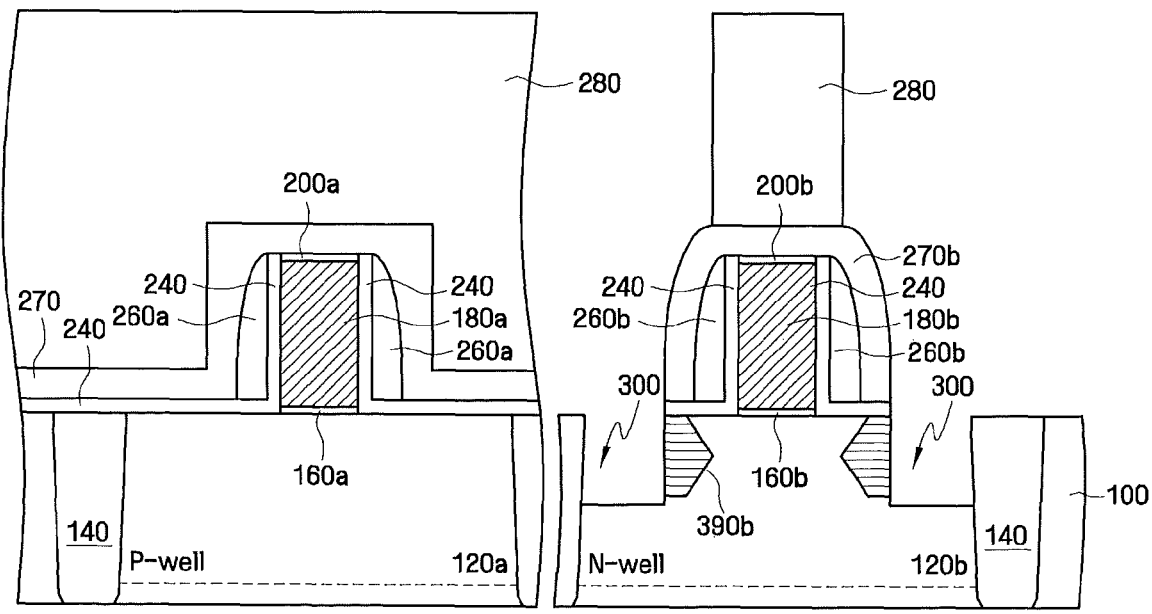
Figure 2I:
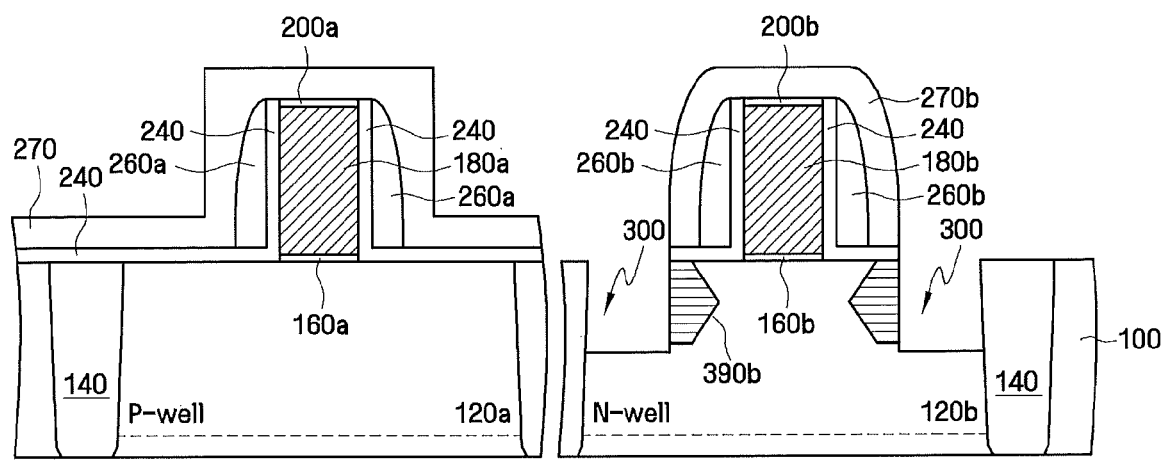
Figure 2J:
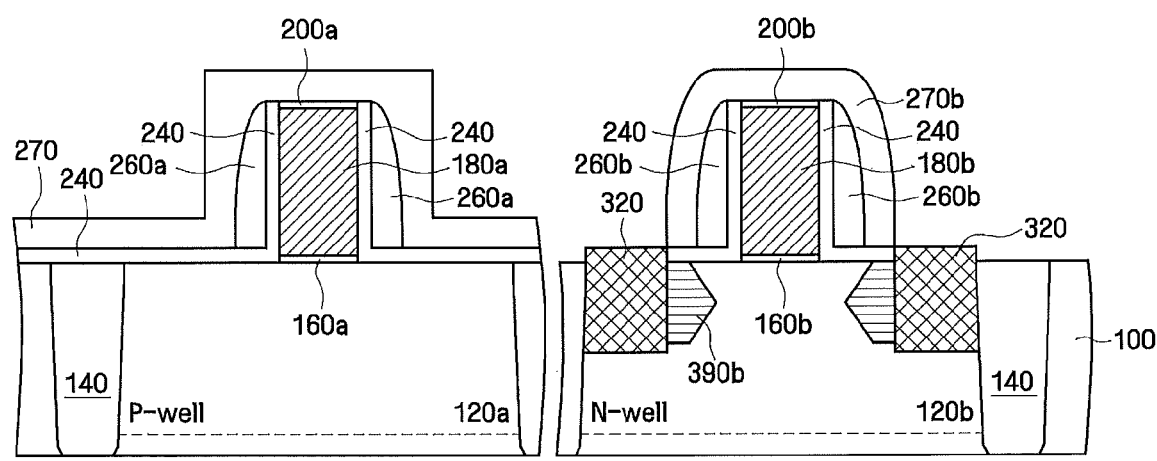
Figure 2K:
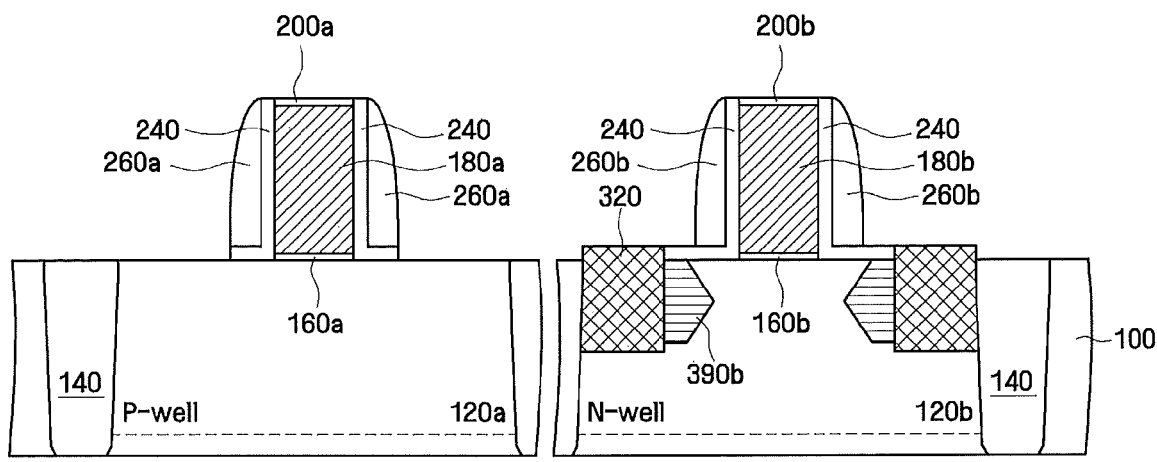
Figure 2L:
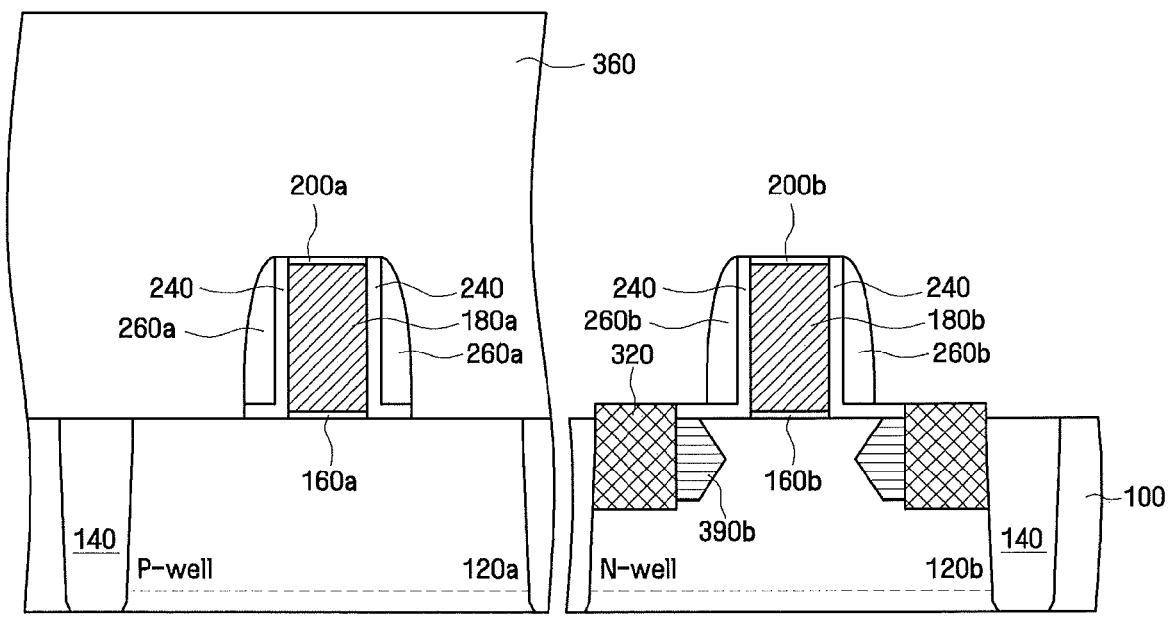
Figure 2M:
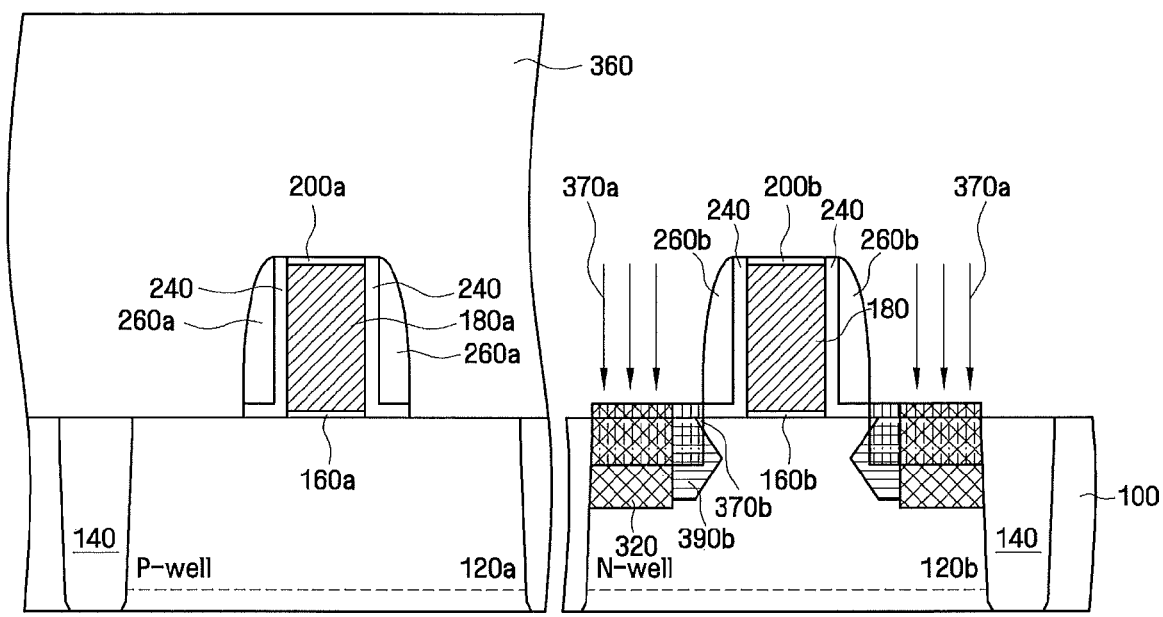
Figure 2N:
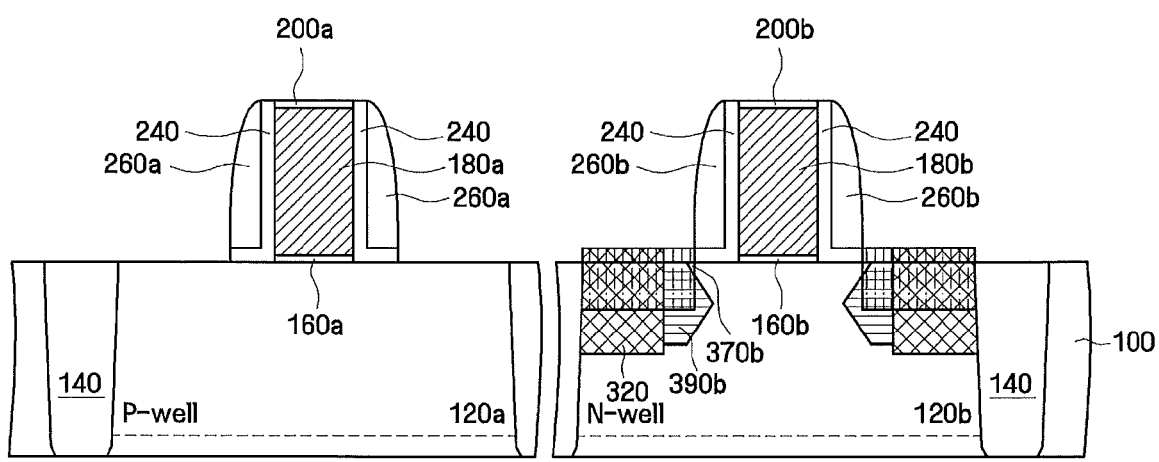

FIGS. 2A-2N illustrate methods of forming integrated circuit transistors according to some embodiments of the present invention.

Figure 1P:
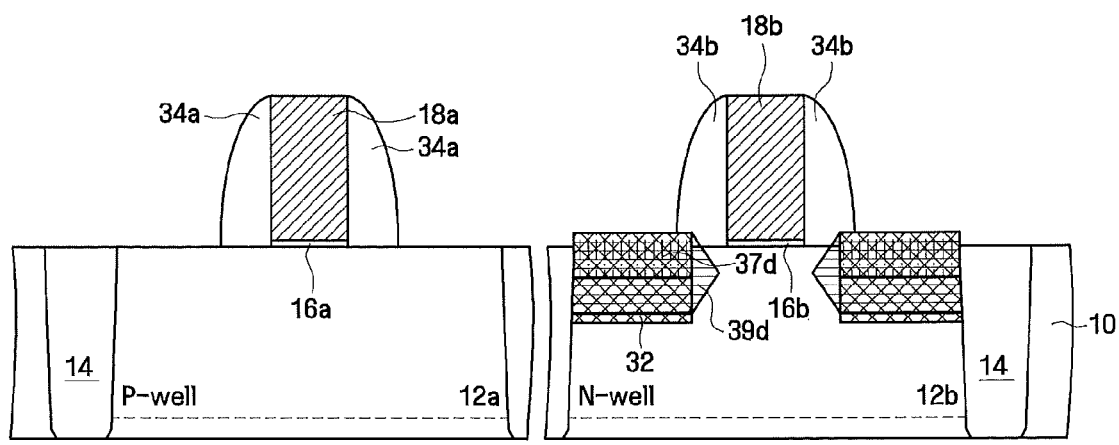

These embodiments of the invention provide relatively early "halo" implantations using a common implantation mask that eliminates the need for the separately formed implantation masks 36 and 40 illustrated by FIGS. 1A-1P. As illustrated by FIG. 2A, these methods include forming a semiconductor substrate 100 having a plurality of electrically insulating trench isolation regions 140 therein. These trench isolation regions 140 are illustrated in FIG. 2A as separating semiconductor well regions of different conductivity type. These semiconductor well regions are illustrated as a P-well region 120a and an adjacent N-well region 120b. A gate electrode of an NMOS transistor and a gate electrode of a PMOS transistor are formed on the P-well region 120a and the N-well region 120b, respectively. The gate electrode of the NMOS transistor is illustrated as including a gate oxide layer 160a, a polysilicon gate layer 180a and an oxide capping layer 200a. The gate electrode of the PMOS transistor is illustrated as including a gate oxide layer 160b, a polysilicon gate layer 180b and an oxide capping layer 200b. An oxide layer 240, which may be formed as a thermal oxide layer having a non-uniform thickness, is formed on a surface of the substrate 100 and on the sidewalls and top surfaces of the gate electrodes, as illustrated.

Referring now to FIGS. 2B-2C, a silicon nitride layer 260 is conformally deposited on the substrate 100 and on the gate electrodes of the NMOS and PMOS transistors. This silicon nitride layer 260 is then etched back to define silicon nitride sidewall spacers 260a and 260b on the gate electrode of the NMOS transistor and on the gate electrode of the PMOS transistor, respectively. This step to etch back the silicon nitride layer may be performed as a dry etching step using a reactive ion etching (RIE) process, for example. Thereafter, a relatively thick oxide spacer layer 270 may be deposited on the substrate 100, as illustrated by FIG. 2D. This oxide spacer layer 270 may be selectively patterned by forming a patterned photoresist mask 280 on the oxide spacer layer 270 and then selectively etching back exposed portions of the oxide spacer layer 270 to define a thinned oxide layer 270' on the N-well region 120b and define oxide spacers 270b on sidewalls of the gate electrode of the PMOS transistor, as illustrated by FIGS. 2E-2F. This etching step is performed using the patterned photoresist mask 280 as an etching mask.

Halo implant regions 390b are then defined in the N-well region 120b by implanting halo region dopants 390a into the N-well region 120b, using the patterned photoresist mask 280 as an implantation mask, as illustrated by FIG. 2G. According to preferred aspects of these embodiments, the halo region dopants 390a are implanted using a quad rotation halo implantation step that performs both horizontal and vertical halo implantation using the same photoresist mask 280 as a implantation mask. Referring now to FIG. 2H, the photoresist mask 280 is then used again along with the oxide spacers 270b during a step to define source/drain region trenches 300 in the N-well region 120b using a reactive ion etching (RIE) step, for example. The photoresist mask 280 is then removed, as illustrated by FIG. 2I, and then an epitaxial growth step is performed to define silicon germanium (SiGe) source and drain regions 320 in the trenches 300, as illustrated by FIG. 2J. Then, as illustrated by FIG. 2K, a hydrofluoric acid (HF) solution may then be used to remove the oxide spacer layer 270 and the oxide spacers 270b from the substrate 100.

Referring now to FIGS. 2L-2N, another photoresist mask 360, which exposes the silicon germanium source and drain regions 320, is formed on the substrate 100. This photoresist mask 360 is used as an implantation mask during a step to implant source/drain region dopants 370a into the source and drain regions 320. An annealing/drive-in step may then be performed to define P-type source/drain regions 370b within the silicon germanium source and drain regions 320. The photoresist mask 360 is then removed to expose the substrate 100, as shown in FIG. 2N. Subsequent process steps, not shown, may then be performed to further define regions of an NMOS transistor within the P-well region 120a and thereby complete a front-end of a CMOS fabrication process.

In the drawings and specification, there have been disclosed typical preferred embodiments of the invention and, That which is claimed is:

1. A method of forming a p-channel MOSFET, the method comprising:
    forming a gate electrode having first sidewall spacers thereon, on a semiconductor substrate;
    forming a sacrificial sidewall spacer layer on the gate electrode;
    patterning a mask layer on the sacrificial sidewall spacer layer;
    selectively etching the sacrificial sidewall spacer layer to define sacrificial sidewall spacers on the first sidewall spacers, using the patterned mask layer as an etching mask;
    performing a PFET halo-implant into portions of the semiconductor substrate extending adjacent the gate electrode, using the sacrificial sidewall spacers as an implant mask; then
    etching source and drain region trenches into the semiconductor substrate, adjacent opposite sides of the gate electrode;
    filling the source and drain region trenches by epitaxially growing SiGe source and drain regions therein;
    selectively removing the sacrificial sidewall spacers from sidewalls of the gate electrode; and
    implanting source and drain region dopants into the SiGe source and drain regions, using the gate electrode and the first sidewall spacers as an implant mask.

2. The method of claim 1, wherein the first sidewall spacers comprise a nitride material; and wherein forming a sacrificial sidewall spacer layer on the gate electrode comprises depositing a sacrificial oxide layer on the gate electrode.

3. The method of claim 1, wherein selectively removing the sacrificial sidewall spacers from sidewalls of the gate electrode comprises exposing the sacrificial sidewall spacers to a hydrofluoric acid solution.

4. The method of claim 1, wherein performing a PFET halo-implant comprises performing a PFET halo-implant into portions of the semiconductor substrate extending adjacent the gate electrode, using the patterned mask layer and the sacrificial sidewall spacers as an implant mask.

5. The method of claim 1, wherein implanting source and drain region dopants comprises both horizontal and vertical implanting.

6. A method of forming p-channel MOSFETs, the method comprising:
    forming first and second gate electrodes extending in orthogonal directions relative to each other, on a semiconductor substrate;
    forming first and second sidewall spacers on the first and second gate electrodes, respectively;
    forming a sacrificial sidewall spacer layer on the first and second gate electrodes;
    patterning a mask layer on the first and second gate electrodes;
    selectively etching the sacrificial sidewall spacer layer to define sacrificial sidewall spacers on the first and second sidewall spacers, using the patterned mask layer as an etching mask;
    performing a quad rotation PFET halo-implant into portions of the semiconductor substrate extending adjacent the first and second gate electrodes, using the patterned mask layer as an implant mask; then
    etching source and drain region trenches into the semiconductor substrate, adjacent opposite sides of the first and second gate electrodes;
    filling the source and drain region trenches by epitaxially growing SiGe source and drain regions therein;
    selectively removing the sacrificial sidewall spacers from sidewalls of the first and second gate electrodes; and
    implanting source and drain region dopants into the SiGe source and drain regions, using the first and second gate electrodes and the first and second sidewall spacers as an implant mask.

7. The method of claim 6, wherein implanting source and drain region dopants comprises both horizontal and vertical implanting.

8. The method of claim 6, wherein the first and second sidewall spacers comprise a nitride material; and wherein forming a sacrificial sidewall spacer layer on the first and second gate electrodes comprises depositing a sacrificial oxide layer on the first and second gate electrodes.

9. The method of claim 6, wherein selectively removing the sacrificial sidewall spacers comprises exposing the sacrificial sidewall spacers to a hydrofluoric acid solution.

10. A method of forming p-channel MOSFETs having SiGe source and drain regions, comprising:
    forming first and second gate electrodes extending in orthogonal directions relative to each other, on a semiconductor substrate;
    patterning a mask layer on the first and second gate electrodes;
    performing a quad rotation PFET halo-implant into portions of the semiconductor substrate extending adjacent the first and second gate electrodes, using the patterned mask layer as an implant mask; then
    etching source and drain region trenches into the semiconductor substrate, adjacent opposite sides of the first and second gate electrodes;
    filling the source and drain region trenches by epitaxially growing SiGe source and drain regions therein; and
    implanting source and drain region dopants into the SiGe source and drain regions, using the first and second gate electrodes as an implant mask.

11. The method of claim 10, wherein implanting source and drain region dopants comprises both horizontal and vertical implanting.

* * * * *